(12) United States Patent
Song

(10) Patent No.: US 11,835,590 B2
(45) Date of Patent: Dec. 5, 2023

(54) BATTERY MANAGEMENT APPARATUS

(71) Applicant: LG Energy Solution, Ltd., Seoul (KR)

(72) Inventor: Hyeon-Jin Song, Daejeon (KR)

(73) Assignee: LG Energy Solution, Ltd.

( * ) Notice: Subject to any disclaimer, the term of this patent is extended or adjusted under 35 U.S.C. 154(b) by 48 days.

(21) Appl. No.: 17/632,667

(22) PCT Filed: Sep. 16, 2020

(86) PCT No.: PCT/KR2020/012507
§ 371 (c)(1),
(2) Date: Feb. 3, 2022

(87) PCT Pub. No.: WO2021/060769
PCT Pub. Date: Apr. 1, 2021

(65) Prior Publication Data
US 2022/0283241 A1    Sep. 8, 2022

(30) Foreign Application Priority Data

Sep. 27, 2019 (KR) .......................... 10-2019-0119917

(51) Int. Cl.
*G01R 31/392* (2019.01)
*G01R 31/396* (2019.01)
(Continued)

(52) U.S. Cl.
CPC ........... *G01R 31/392* (2019.01); *G01R 19/12* (2013.01); *G01R 31/396* (2019.01); *H02J 7/00714* (2020.01)

(58) Field of Classification Search
None
See application file for complete search history.

(56) References Cited

U.S. PATENT DOCUMENTS 6,356,055 B1    3/2002  Lin et al.
2014/0028263 A1*  1/2014  Jo .......................... H02J 7/0016
                                                    320/128
(Continued)

FOREIGN PATENT DOCUMENTS

JP    2006333662 A    12/2006
JP    2006333682 A    12/2006
(Continued)

OTHER PUBLICATIONS

Extended European Search Report including Written Opinion for Application No. 20869897.7 dated Aug. 11, 2022, pp. 1-6.
(Continued)

*Primary Examiner* — Jas A Sanghera
(74) *Attorney, Agent, or Firm* — Lerner David LLP

(57) ABSTRACT

A battery management apparatus includes a measuring unit configured to measure a voltage of each of a plurality of battery cells, a converter connected to corresponding battery cells among the plurality of battery cells and configured to form a charge and discharge path between the connected battery cells according to an operation state of a switch included therein, and a control unit configured to receive a voltage value of each of the plurality of battery cells from the measuring unit, control the operation state of the switch included in the converter, calculate a voltage change rate of a charging cell charged by the converter according to the control of the operation state of the switch, and determine whether the charging cell is degraded based on the calculated voltage change rate.

11 Claims, 4 Drawing Sheets

(51) Int. Cl.
   *H02J 7/00*    (2006.01)
   *G01R 19/12*   (2006.01)

(56) References Cited

U.S. PATENT DOCUMENTS

| | | |
|---|---|---|
| 2014/0188315 A1 | 7/2014 | Kang et al. |
| 2015/0311736 A1* | 10/2015 | Park ..................... H02J 7/0047 |
| | | 320/103 |
| 2019/0097438 A1 | 3/2019 | Song et al. |
| 2020/0269699 A1 | 8/2020 | Nakanishi et al. |

FOREIGN PATENT DOCUMENTS

| | | | |
|---|---|---|---|
| JP | 2008276970 | A | 11/2008 |
| JP | 2014230343 | A | 12/2014 |
| JP | 2016114584 | A | 6/2016 |
| JP | 2016134965 | A | 7/2016 |
| JP | 201746553 | A | 3/2017 |
| JP | 2017125729 | A | 7/2017 |
| KR | 101165593 | B1 | 7/2012 |
| KR | 20130125141 | A | 11/2013 |
| KR | 101394751 | B1 | 5/2014 |
| KR | 20150124233 | A | 11/2015 |
| KR | 101865402 | B1 | 7/2018 |
| KR | 20190035441 | A | 4/2019 |

OTHER PUBLICATIONS

International Search Report for PCT/KR2020/012507 dated Jan. 4, 2021. 3 pgs.

* cited by examiner

BATTERY MANAGEMENT APPARATUS

CROSS-REFERENCE TO RELATED APPLICATIONS

The present application is a national phase entry under 35 U.S.C. § 371 of International Application No. PCT/KR2020/012507 filed Sep. 16, 2020, published in Korean, which claims priority from Korean Patent Application No. 10-2019-0119917 filed Sep. 27, 2019, all of which are incorporated herein by reference.

TECHNICAL FIELD

The present disclosure relates to a battery management apparatus, and more particularly, to a battery management apparatus for determining whether each of a plurality of battery cells is degraded.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

Meanwhile, the battery may be degraded due to various factors. One of the measures to measure the degree of degradation of the battery is an internal resistance of the battery. Conventionally, there have been proposed various methods for estimating the aging of a battery using an internal resistance of a battery.

As an example, Patent Literature 1 discloses a battery aging diagnosis method and system. Here, an equivalent circuit model including a voltage source, an internal resistance and Warburg impedance is modeled as a battery, and battery aging is diagnosed based on the internal resistance of the modeled battery.

However, in Patent Literature 1, since the method of diagnosing battery aging is configured differently depending on the presence or absence of an external resistance, there is a problem in that a separate process is required to determine the presence or absence of an external resistance before diagnosing the aging/degradation of the battery. In addition, in Patent Literature 1, since the aging of the battery is diagnosed based on the internal resistance of the modeled battery by using the recursive least square method or the like, there is a problem in that a lot of time and system resources are required for diagnosing the aging.

(Patent Literature 1) KR 10-2019-0035441 A

DISCLOSURE

Technical Problem

The present disclosure is designed to solve the problems of the related art, and therefore the present disclosure is directed to providing a battery management apparatus, which may determine whether each battery cell is degraded due to an internal resistance while a plurality of battery cells are being charged and discharged.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery management apparatus, comprising: a voltage sensor configured to measure a respective voltage of each of a plurality of battery cells; a converter connected to at least a pair of the plurality of battery cells and configured to form a charge and discharge path between the at least a pair of battery cells according to an operation state of a switch included in the converter; and a control unit configured to: receive a respective voltage value of each of the plurality of battery cells from the voltage sensor; control the operation state of the switch included in the converter; calculate a voltage change rate of a charging cell charged by the converter based on the operation state of the switch; and determine whether the charging cell is degraded based on the calculated voltage change rate.

The control unit may be configured to obtain an initial voltage value of the charging cell from the voltage sensor; calculate the voltage change rate of the charging cell for a predetermined duration of time based on the initial voltage value; compare the calculated voltage change rate to a predetermined reference rate; and determine whether the charging cell is degraded based on the comparison.

The battery management apparatus may include a plurality of converters including the converter, and each of the plurality of converters may be positioned between a respective pair of battery cells of the plurality of battery cells. Each of the plurality of converters may include a respective switch.

The control unit may be configured to control the operation state of each switch included in the plurality of converters and determine whether each charging cell charged by the plurality of converters is degraded.

The control unit may be configured to sequentially control the operation states of each of the switches included in the plurality of converters to a turn-on state; and determine whether each of the plurality of battery cells is degraded based on the sequential control.

The sequential control of the plurality of converters may include selection of a respective converter at every predetermined time interval.

The converter may include a first circuit including the switch, a discharging cell and a first inductor connected in series; and a second circuit including the charging cell and a second inductor configured to be inductively coupled to the first inductor connected in series.

The second circuit may be configured to charge the charging cell using an induced electromotive force of the second inductor induced by the first inductor in response to the operation state of the switch being controlled to a turn-on state.

The second circuit may further include a third inductor connected in series between the second inductor and the charging cell, and the second circuit may be configured to charge the charging cell using an induced electromotive force of the third inductor induced by a change of the induced electromotive force of the second inductor in response to the operation state of the switch being changed from the turn-on state to a turn-off state.

The battery management apparatus may include a current sensor configured to measure a charging current for the charging cell.

The control unit may be configured to control the operation state of the switch to bring a magnitude of the charging current measured by the current sensor within a predetermined current range.

In another aspect of the present disclosure, the converter may be connected to at least three battery cells of the plurality of battery cells, the battery management apparatus the battery management apparatus may further comprise a cell selection circuit connected between the at least three battery cells and the converter and configured to: receive a cell selection command from the control unit; and connect a portion of the at least three battery cells to the converter based on the received cell selection command.

A battery pack according to still another aspect of the present disclosure may comprise the battery management apparatus according to any of the embodiments of the present disclosure.

Advantageous Effects

According to an aspect of the present disclosure, since not only whether each of a plurality of battery cells is degraded is estimated but also an internal resistance is estimated, it is possible to improve accuracy and reliability of degradation determination.

In addition, according to an aspect of the present disclosure, since rapid change in charging current is prevented using a plurality of inductors, there is an advantage in that degradation of the battery cell caused by the rapid change in charging current may be prevented in advance.

The effects of the present disclosure are not limited to the above, and other effects not mentioned herein will be clearly understood by those skilled in the art from the appended claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
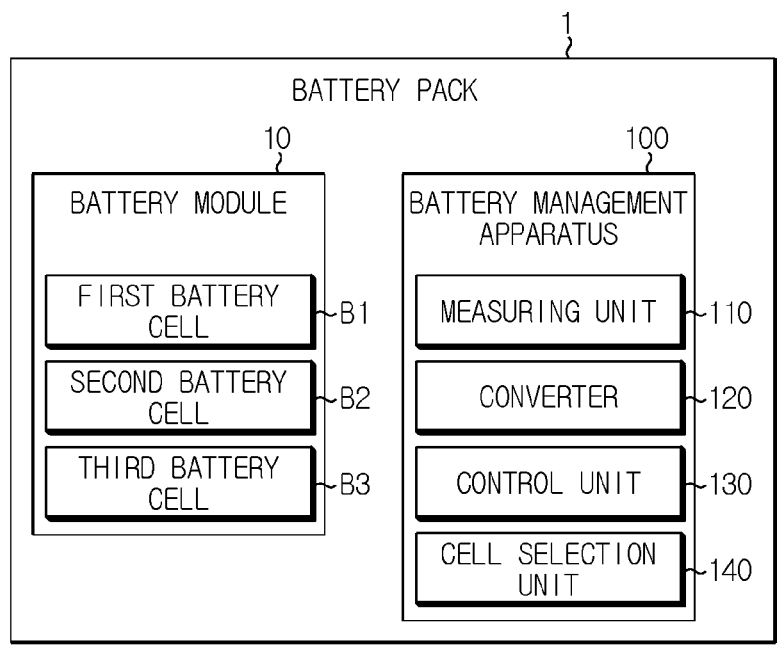
FIG. 1 is a block diagram schematically showing a battery pack including a battery management apparatus according to an embodiment of the present disclosure.
Figure 2:
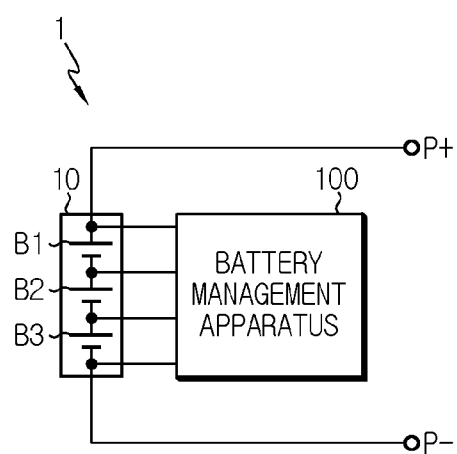
FIG. 2 is a diagram schematically showing a configuration of the battery pack including the battery management apparatus according to an embodiment of the present disclosure.
Figure 3:
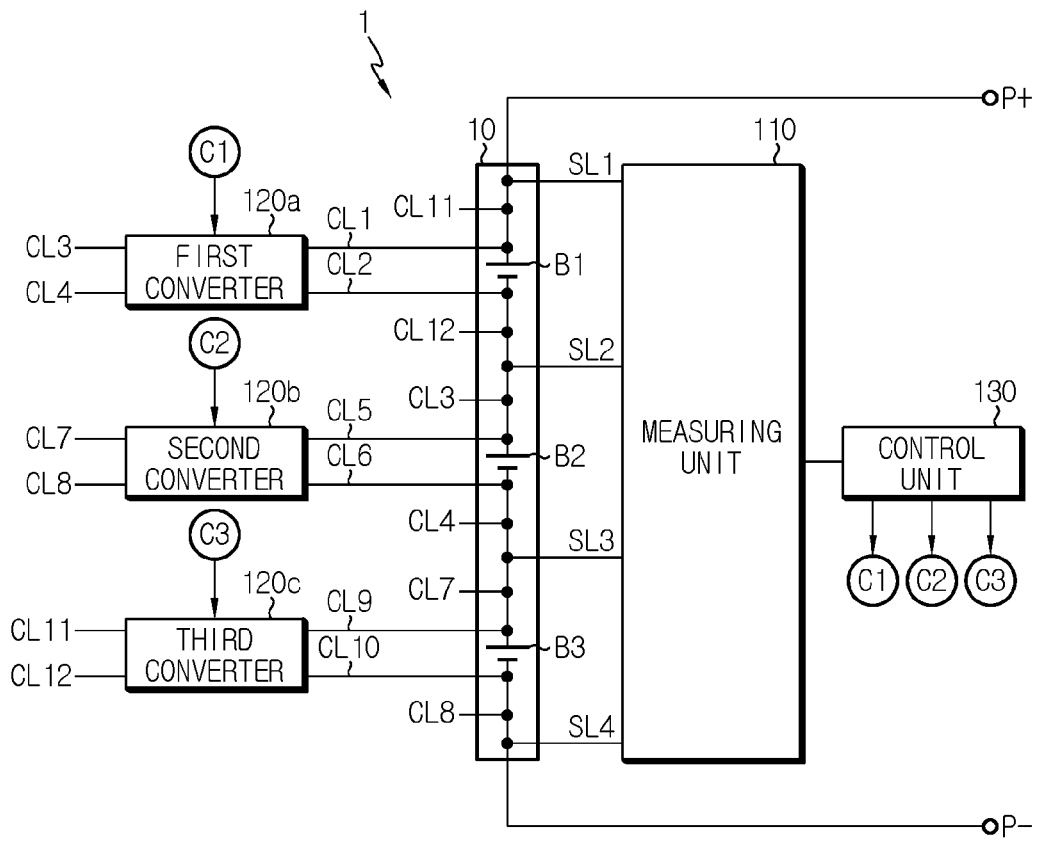
FIG. 3 is a diagram schematically showing the battery pack including the battery management apparatus according to an embodiment of the present disclosure.

FIG. 1 is a block diagram schematically showing a battery pack 1 including a battery management apparatus 100 according to an embodiment of the present disclosure. FIG. 2 is a diagram schematically showing a configuration of the battery pack 1 including the battery management apparatus 100 according to an embodiment of the present disclosure. FIG. 3 is a diagram schematically showing the battery pack 1 including the battery management apparatus 100 according to an embodiment of the present disclosure.

Referring to FIGS. 1 and 2, the battery pack 1 may include a battery module 10 and a battery management apparatus 100.

The battery module 10 may be a cell assembly including at least one battery cell. Here, the battery cell refers to one independent cell that has a negative electrode terminal and a positive electrode terminal and is physically separable. For example, one pouch-type lithium polymer cell may be regarded as the battery cell.

If a plurality of battery cells B1 to B3 are included in the battery module 10, the plurality of battery cells B1 to B3 may be connected in series and/or in parallel. For example, referring to FIG. 1, the battery module 10 may include a first battery cell B1, a second battery cell B2, and a third battery cell B3. There is no limit to the number of battery cells that may be included in the battery module 10, but for convenience of description, it will be described that the first battery cell B1, the second battery cell B2 and the third battery cell B3 are included in the battery module 10.

In addition, referring to FIG. 2, the positive electrode terminal of the battery module 10 may be connected to a positive electrode terminal (P+) of the battery pack 1. The negative electrode terminal of the battery module 10 may be connected to a negative electrode terminal (P−) of the battery pack 1.

Referring to FIG. 1, the battery management apparatus 100 may include a measuring unit 110, a converter 120, and a control unit 130.

The measuring unit 110 may be configured to measure a voltage of each of the plurality of battery cells B1 to B3.

Specifically, the measuring unit 110 may measure the voltage of each of the plurality of battery cells B1 to B3 by measuring potentials at both ends of the plurality of battery cells B1 to B3 and calculating a difference between the measured potentials at both ends.

For example, in the embodiment of FIG. 3, the measuring unit 110 may be connected to each of the plurality of battery cells B1 to B3 through a plurality of connected sensing lines. Specifically, the measuring unit 110 may be connected to the first battery cell B1 through a first sensing line SL1 and a second sensing line SL2 and be connected to the second battery cell B2 through the second sensing line SL2 and a third sensing line SL3. In addition, the measuring unit 110 may be connected to the third battery cell B3 through the third sensing line SL3 and a fourth sensing line SL4.

In addition, the measuring unit 110 may measure a positive electrode potential of the first battery cell B1 through the first sensing line SL1, and measure a negative electrode potential of the first battery cell B1 through the second sensing line SL2. Also, the measuring unit 110 may measure the voltage of the first battery cell B1 by calculating a difference between the measured positive electrode potential and the measured negative electrode potential of the first battery cell B1. In this way, the measuring unit 110 may measure the voltage of the second battery cell B2 and the voltage of the third battery cell B3.

The converter 120 may be configured to be connected to corresponding battery cell among the plurality of battery cells B1 to B3. Here, the converter 120 may be a DC-DC converter that receives and converts a DC current and outputs the converted DC current. That is, the converter 120 may be connected to a battery cell that receives the DC current and a battery cell to which the converted DC current is applied.

For example, the converter 120 may be connected to the first battery cell B1 and the second battery cell B2 among the plurality of battery cells B1 to B3 shown in FIG. 1. In this case, the converter 120 may receive a DC current from the first battery cell B1, convert the received DC current, and output the converted DC current to the second battery cell B2.

In addition, the converter 120 may be configured to form a charge and discharge path between the connected battery cells according to an operation state of a switch included therein.

The converter 120 may include a switch therein to turn on/off the operation state of the converter 120.

For example, as in the former embodiment, it is assumed that the converter 120 is connected to the first battery cell B1 and the second battery cell B2. The converter 120 may receive a DC current from the first battery cell B1 only when the operation state of the switch included therein is a turn-on state. After that, the converter 120 may convert the DC current input from the first battery cell B1. In addition, the converter 120 may output the converted DC current to the second battery cell B2. In this process, the first battery cell B1 may be discharged and the second battery cell B2 may be charged.

The control unit 130 may be configured to receive a voltage value of each of the plurality of battery cells B1 to B3 from the measuring unit 110.

Specifically, the control unit 130 may be electrically connected to the measuring unit 110. That is, the control unit 130 may be connected to the measuring unit 110 by wire and/or wirelessly, and may be configured to communicate with the measuring unit 110. Accordingly, the control unit 130 may receive measurement values measured by the measuring unit 110 from the measuring unit 110.

For example, referring to the embodiment of FIG. 3, the measuring unit 110 and the control unit 130 may be connected through a wired line. The measuring unit 110 may measure the voltage of each of the plurality of battery cells B1 to B3 through the plurality of sensing lines, and transmit a voltage value for the measured voltage to the control unit 130 in the form of a digital signal. The control unit 130 may receive the digital signal from the measuring unit 110 and interpret the digital signal to obtain the voltage value of each of the plurality of battery cells B1 to B3 measured by the measuring unit 110.

In addition, the control unit 130 may be configured to control the operation state of the switch included in the converter 120.

Specifically, the control unit 130 may be electrically connected to the converter 120 as well as the measuring unit 110. The converter 120 does not require a separate operating power, and may be turned on/off according to the operation state of the switch included therein. Therefore, the control unit 130 may be electrically connected to the switch included in the converter 120. That is, the control unit 130 may control the operation state of the switch to a turn-on or turn-off state by transmitting a signal to the switch included in the converter 120.

In addition, the control unit 130 may be configured to calculate a voltage change rate of the charging cell charged by the converter 120 according to the control of the operation state control of the switch.

Here, the charging cell may be a battery cell to which the DC current output from the converter 120 is applied. That is, in the former embodiment, the second battery cell B2 may correspond to the charging cell.

Specifically, the measuring unit 110 may continuously measure the voltage of the charging cell while the charging cell is being charged. In addition, the control unit 130 may receive the voltage value of the charging cell measured by the measuring unit 110 and calculate a voltage change rate while the charging cell is being charged.

Here, the voltage change rate may be a rate at which the voltage of the charging cell changes during a charging time. For example, the control unit 130 may calculate the voltage change rate for how much the voltage of the charging cell increases compared to an initial charging stage, based on the voltage value of the charging cell measured by the measuring unit 110.

Finally, the control unit 130 may be configured to determine whether the charging cell is degraded based on the calculated voltage change rate.

Preferably, the control unit 130 may determine whether the charging cell is degraded, based on an absolute value of the calculated voltage change rate.

Considering Ohm's law, the absolute value of the voltage change rate of the battery cell may increase while the battery cell is being charged, when the amount of current applied to the battery cell increases during the charging process and/or when the internal resistance of the battery cell itself is increased. Accordingly, by determining whether the charging cell is degraded based on the calculated voltage change rate, the control unit 130 may determine whether the internal resistance of the charging cell is increased and estimate the internal resistance value of the charging cell.

The battery management apparatus 100 has an advantage of determining whether the battery cell is degraded and estimating the internal resistance value of the battery cell by using a simple circuit configuration that charges and discharges battery cells through the converter 120.

Therefore, even if a separate measuring device for measuring the internal resistance of the battery cell is not provided, the battery management apparatus 100 has an advantage of easily estimating the internal resistance of the battery cell.

Meanwhile, the control unit 130 provided to the battery management apparatus 100 may optionally include a processor known in the art, an application-specific integrated circuit (ASIC), another chipset, a logic circuit, a register, a communication modem, a data processing device, and the like in order to execute various control logics performed in the present disclosure. In addition, when the control logic is implemented in software, the control unit 130 may be implemented as a set of program modules. In this case, the program module may be stored in a memory and executed by the control unit 130.

That is, the memory may store data or programs required for the control unit 130 to determine whether the battery cell is degraded. That is, the memory may store data necessary for operation and function of each component of the battery management apparatus 100, data generated in the process of performing the operation or function, or the like. The memory is not particularly limited in its kind as long as it is a known information storage means that can record, erase, update and read data. As an example, the information storage means may include RAM, flash memory, ROM, EEPROM, registers, and the like. In addition, the memory may store program codes in which processes executable by the control unit 130 are defined. The memory may be provided inside or out of the control unit or may be connected to the control unit 130 using a well-known means.

The control unit 130 may be configured to obtain an initial voltage value of the charging cell from the measuring unit 110.

The control unit 130 may obtain the initial voltage value of the charging cell in order to calculate the voltage change rate of the charging cell while the charging cell is being charged. Preferably, the control unit 130 may transmit a turn-on command to the switch included in the converter 120 and then obtain the initial voltage value of the charging cell from the measuring unit 110. More preferably, the control unit 130 may transmit the turn-on command to the switch and obtain the initial voltage value of the charging cell from the measuring unit 110 immediately after the time passes until the turn-on command reaches the switch.

The control unit 130 may be configured to calculate the voltage change rate of the charging cell based on the initial voltage value for a predetermined time.

That is, the control unit 130 may calculate the voltage change rate of the charging cell for a predetermined time based on the obtained initial voltage value. For example, if the initial voltage value of the charging cell obtained by the control unit 130 is 3.0 V and the voltage of the charging cell is 3.3 V after a predetermined time passes, the control unit 130 may calculate the voltage change rate as 10%.

In addition, the control unit 130 may be configured to determine whether the charging cell is degraded according to a result of comparing the calculated voltage change rate with a reference rate.

Here, the reference rate is a value stored in the control unit 130 or a separate storage unit, and may be a preset rate as a voltage change rate when a battery cell in a BOL (Beginning of Life) state and thus not degraded is charged for the predetermined time. Therefore, the control unit 130 may determine whether the battery cell is degraded by comparing the reference rate and the voltage change rate.

Further, the control unit 130 may estimate an internal resistance increase rate of the charging cell with respect to an internal resistance of the BOL battery cell by comparing the reference rate with the measured voltage change rate and comparing a current change amount when setting the reference rate with a current change amount when charging the charging cell.

For example, it is assumed that the preset reference rate is 8% and the voltage change rate of the charging cell calculated by the control unit 130 as in the former embodiment is 10%. In addition, it is assumed that the current change amount during a predetermined time when the reference rate is set and the current change amount during the predetermined time when the charging cell is charged are the same. In this case, the control unit 130 may estimate that the internal resistance of the charging cell is increased by 2% compared to the internal resistance of the BOL battery cell. Therefore, if the internal resistance of the BOL battery cell is known, the control unit 130 may estimate the internal resistance of the charging cell at present based on the voltage change rate while the charging cell is being charged.

That is, since the battery management apparatus 100 determines whether the charging cell is degraded by comparing the reference rate with the calculated voltage change rate, it is possible to rapidly determine whether the charging cell is degraded even if the charging cell is not fully charged but is charged only for a predetermined time. In addition, the battery management apparatus 100 has an advantage of conveniently estimating the internal resistance value as well as whether the battery cell charged by the converter 120 is degraded.

The converter 120 may be provided in plural so as to be connected to corresponding battery cells among the plurality of battery cells B1 to B3.

Each of the plurality of converters 120a to 120c may be connected to corresponding battery cells among the plurality of battery cells B1 to B3. Preferably, each of the plurality of converters 120a to 120c may be connected to a battery cell for introducing a DC current and a battery cell for outputting the converted DC current. That is, among the plurality of battery cells B1 to B3, two battery cells may form a pair and be connected to any one of the plurality of converters 120a to 120c.

For example, referring to FIG. 3, corresponding to the number of a plurality of battery cells B1 to B3 included in the battery module 10, the battery management apparatus 100 may include a first converter 120a, a second converter 120b, and a third converter 120c.

The first converter 120a may be connected to the first battery cell B1 and the second battery cell B2. Specifically, the first converter 120a may be connected to the first battery cell B1 through a first line CL1 and a second line CL2 and be connected to the second battery cell B2 through a third line CL3 and a fourth line CL4. Here, the first converter 120a may be configured to receive a DC current from the first battery cell B1 through the first line CL1 and the second line CL2 and output the converted DC current to the second battery cell B2 through the third line CL3 and the fourth line CL4.

Similarly, the second converter 120b may be connected to the second battery cell B2 through a fifth line CL5 and a sixth line CL6 and be connected to the third battery cell B3 through a seventh line CL7 and an eighth line CL8.

In addition, the third converter 120c may be connected to the third battery cell B3 through a ninth line CL9 and a tenth line CL10 and be connected to first battery cell B1 through an eleventh line CL11 and a twelfth line CL12.

The control unit 130 may be configured to control an operation state of a switch included in each of the plurality of converters 120a to 120c.

Specifically, a switch capable of turning on/off the operation state of the converter 120 may be provided in each of the plurality of converters 120a to 120c. The control unit 130 may be electrically connected to the switch included in each of the plurality of converters 120a to 120c to transmit a turn-on command or a turn-off command. For example, in the embodiment of FIG. 3, the control unit 130 may transmit a signal to the switch included in the first converter 120a through a first command line C1. In addition, the control unit 130 may transmit a signal to the switch included in the second converter 120b through a second command line C2. In addition, the control unit 130 may transmit a signal to the switch included in the third converter 120c through a third command line C3.

Here, it is assumed that the control unit 130 outputs a turn-off signal through the first command line C1 and the third command line C3, and outputs a turn-on signal through the second command line C2. Only the operation state of the second converter 120b may be turned on, and the current of the second battery cell B2 may flow into the second converter 120b through the fifth line CL5 and the sixth line CL6. In addition, the second converter 120b may output the converted current to the third battery cell B3 through the seventh line CL7 and the eighth line CL8. In this case, the second battery cell B2 may be discharged, and the third battery cell B3 may be charged. That is, the second battery cell B2 may be a discharging cell, and the third battery cell B3 may be a charging cell.

The control unit 130 may be configured to determine whether each charging cell charged by the plurality of converters 120a to 120c is degraded.

For example, in the embodiment of FIG. 3, the control unit 130 may discharge and charge all battery cells included in the battery module 10 according to a line through which the turn-on command is received among the first command line C1, the second command line C2 and the third command line. In this case, the control unit 130 may determine whether each of the plurality of battery cells B1 to B3 is degraded while each of the plurality of battery cells B1 to B3 is being charged.

Specifically, for example, in the embodiment of FIG. 3, the control unit 130 may transmit the turn-on command through the first command line C1. In addition, the control unit 130 may determine whether the second battery cell B2 serving as a charging cell is degraded. After that, the control unit 130 may transmit the turn-on command through the third command line C3. In addition, the control unit 130 may determine whether the first battery cell B1 serving as a charging cell is degraded.

That is, the battery management apparatus 100 has an advantage of determining whether each of the plurality of battery cells B1 to B3 is degraded without a complicated circuit configuration by controlling the operation state of the switch included in each of the plurality of converters 120a to 120c.

In addition, since the battery management apparatus 100 may independently control the switches included in the plurality of converters 120a to 120c, there is an advantage of selectively and independently determining whether the plurality of battery cells B1 to B3 are degraded.

The control unit 130 may be configured to sequentially control the operation states of the switches included in the plurality of converters 120a to 120c to a turn-on state.

The control unit 130 may control the operation states of the switches included in the plurality of converters 120a to 120c according to identification numbers of the plurality of converters 120a to 120c. For example, the control unit 130 may sequentially control the operation states of the switches included in the first converter 120a, the second converter 120b and the third converter 120c through the first command line C1, the second command line C2 and the third command line C3.

In addition, the control unit 130 may sequentially control the plurality of converters 120a to 120c so that they are not repeatedly controlled. That is, the sequential control in this case may mean that the switches respectively included in the plurality of converters 120a to 120c are controlled only once without being repeatedly controlled. For example, in the embodiment of FIG. 3, if it is assumed that the control unit 130 transmits the turn-on command several times through the first command line C1 and transmits the turn-on command only once through the second command line C2 and the third command line C3, the capacity and the degree of degradation may be different between the first battery cell B1, the second battery cell B2 and the third battery cell B3. Accordingly, the control unit 130 may be configured to transmit the turn-on command to the switch included in each of the plurality of converters 120a to 120c only once without being repeated.

Preferably, in the embodiment of FIG. 3, the control unit 130 may output the turn-on signal through the first command line C1 to control the operation state of the switch included in the first converter 120a to a turn-on state. In addition, after a predetermined time passes, the control unit 130 may output the turn-off signal through the first command line C1 to control the operation state of the switch included in the first converter 120a to a turn-off state.

After that, the control unit 130 may output the turn-on signal through the second command line C2 to control the operation state of the switch included in the second converter 120b to a turn-on state. In addition, after a predetermined time passes, the control unit 130 may output the turn-off signal through the second command line C2 to control the operation state of the switch included in the second converter 120b to a turn-off state.

Finally, the control unit 130 may output the turn-on signal through the third command line C3 to control the operation state of the switch included in the third converter 120c to a turn-on state. In addition, after a predetermined time passes, the control unit 130 may output the turn-off signal through the second command line C3 to control the operation state of the switch included in the third converter 120c to a turn-off state.

That is, the control unit 130 may control the operation states of the switches respectively included in the plurality of converters 120a to 120c to a turn-on state or a turn-off state by sequentially outputting turn-on signals through different command lines at predetermined time intervals.

As described above, if the control unit 130 sequentially controls the operation states of the switches included in the plurality of converters 120a to 120c, each of the plurality of battery cells B1 to B3 may be charged and discharged at least once. That is, since the number of times of charging and discharging of the plurality of battery cells B1 to B3 is maintained identically by sequential control of the control unit 130, a performance deviation of the plurality of battery cells B1 to B3 may be minimized.

In addition, the control unit 130 may be configured to determine whether each of the plurality of battery cells B1 to B3 is degraded.

Specifically, the control unit 130 may sequentially control the operation states of the switches included in the plurality of converters 120a to 120c to determine whether a corresponding charging cell is degraded.

For example, as in the former embodiment, if the control unit 130 outputs the turn-on signal through the first command line C1, since the second battery cell B2 is charged by the first converter 120a, the control unit 130 may determine whether the second battery cell B2 is degraded. In addition, the control unit 130 may output the turn-off signal through the first command line C1.

Thereafter, if the control unit 130 outputs the turn-on signal through the second command line C2 at a predetermined time interval, since the third battery cell B3 is charged by the second converter 120b, the control unit 130 may determine whether the third battery cell B3 is degraded. In addition, the control unit 130 may output the turn-off signal through the second command line C2.

Finally, if the control unit 130 outputs the turn-on signal through the third command line C3 at a predetermined time interval, since the first battery cell B1 is charged by the third converter 120c, the control unit 130 may determine whether the first battery cell B1 is degraded. In addition, the control unit 130 may output the turn-off signal through the third command line C3.

That is, by sequentially outputting the turn-on signals through the plurality of command lines, the control unit 130 may sequentially determine whether each of the plurality of battery cells B1 to B3 included in the battery module 10 is degraded.

The battery management apparatus 100 may independently determine whether each of the plurality of battery cells B1 to B3 included in the battery module 10 is degraded while minimizing the performance deviation of the plurality of battery cells B1 to B3 by sequentially outputting signals for controlling the switches respectively included in the plurality of converters 120a to 120c.

The control unit 130 may be configured to select one target converter at every predetermined time interval among the plurality of converters.

That is, the control unit 130 may select the target converter so that some battery cells are not repeatedly determined whether or not to be degraded, before completely determining whether the plurality of battery cells B1 to B3 are degraded.

For example, the control unit 130 may be configured to set a separate flag to check a converter for which degradation is determined among the plurality of converters 120a to 120c, and to select a target converter among converters for which degradation is not determined. Specifically, the control unit 130 may set the flag for a converter for which degradation is not determined to be 0, and set the flag for a converter for which degradation is determined to be 1. In addition, the control unit 130 may select a target converter among converters for which the flag is set to 0.

In addition, the control unit 130 may be configured to control the operation state of the switch included in the selected target converter to a turn-on state.

For example, in the embodiment of FIG. 3, it is assumed that the first converter 120a, the second converter 120b and the third converter 120c are not all selected in advance. The control unit 130 may select the first converter 120a as a target converter among the first converter 120a, the second converter 120b and the third converter 120c according to a converter identification number. In addition, the control unit 130 may control the operation state of the switch included in the first converter 120a to a turn-on state by transmitting a turn-on signal through the first command line C1 corresponding to the first converter 120a that is a target converter.

When determining whether the plurality of battery cells B1 to B3 are degraded, the battery management apparatus 100 may control the plurality of converters 120a to 120c in the same number of times in order to maintain the same number of times of charging and discharging of each battery cell. Therefore, since the performance deviation between the plurality of battery cells B1 to B3 is reduced, the efficiency of the battery module 10 may be maximized ultimately.

Hereinafter, the internal configuration of the converter will be described in detail with reference to FIG. 4.

Figure 4:
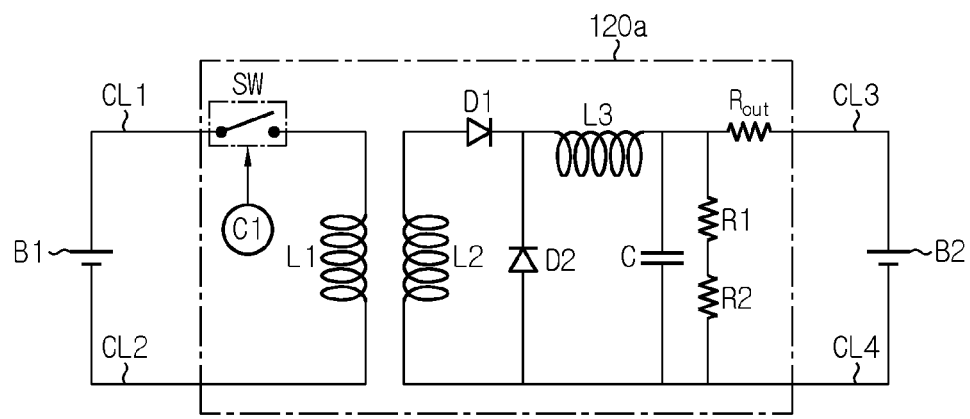
FIG. 4 is a diagram showing a connection configuration between a converter and a battery cell of the battery management apparatus according to an embodiment of the present disclosure.

FIG. 4 is a diagram showing a connection configuration between the converter 120 and the battery cell of the battery management apparatus 100 according to an embodiment of the present disclosure.

Specifically, FIG. 4 is a diagram showing a connection configuration in which the first battery cell B1, the second battery cell B2 and the first converter 120a are connected.

More specifically, referring to FIG. 4, the first converter 120a may be connected to the positive electrode terminal of the first battery cell B1 through the first line CL1, and the first converter 120a may be connected to the negative electrode terminal of the first battery cell B1 through the second line CL2. In addition, the first converter 120a may be connected to the positive electrode terminal of the second battery cell B2 through the third line CL3, and the first converter 120a may be connected to the negative electrode terminal of the second battery cell B2 through the fourth line CL4.

The converter 120 may be configured to include a first circuit in which the switch SW, a discharging cell corresponding to the charging cell, and a first inductor L1 are connected in series.

For example, in the embodiment of FIG. 4, a closed circuit in which the first battery cell B1, the switch SW and the first inductor L1 are connected in series may be the first circuit. That is, the first battery cell B1 connected to the first circuit may be regarded as a discharging cell that outputs the DC current to the first converter 120a.

Referring to the embodiment of FIG. 4, one end of the switch SW may be directly connected to the positive electrode terminal of the first battery cell B1, and the other end may be directly connected to one end of the first inductor L1. In addition, the other end of the first inductor L1 may be directly connected to the negative electrode terminal of the first battery cell B1, so that the first circuit forms a closed circuit. However, since the embodiment of FIG. 4 is an embodiment for the first circuit, the switch SW may also be disposed between the first inductor L1 and the negative electrode terminal of the first battery cell B1.

In addition, the converter 120 may be configured to include a second circuit in which the charging cell and the second inductor L2 corresponding to the first inductor L1 are connected in series.

That is, in the embodiment of FIG. 4, a circuit to which the second battery cell B2 and the second inductor L2 are connected may be the second circuit.

Specifically, the second circuit may include a first diode D1 for controlling the flow of current caused by a second induced electromotive force generated at the second inductor L2. Here, the first diode D1 may be disposed on the second circuit between the second inductor L2 and the positive electrode terminal of the second battery cell B2, so that a direction toward the positive electrode terminal of the second battery cell B2 is a forward direction.

The second circuit may be configured to charge the charging cell by using an induced electromotive force of the second inductor L2 induced by the first inductor L1 when the operation state of the switch SW is controlled to a turn-on state.

For example, the first inductor L1 may be a primary coil, and the second inductor L2 may be a secondary coil. Accordingly, an induced electromotive force may be induced at the second inductor L2, which is a secondary coil, according to the change of the current flowing through the first inductor L1, which is a primary coil. The second circuit may charge the charging cell by using the current generated by the induced electromotive force of the second inductor L2.

Specifically, if the operation state of the switch SW of the first circuit is controlled to a turn-on state, the battery cell provided in the first circuit may be discharged. In this case, the current output from the battery cell may flow through the first inductor L1, and a magnetic field may be formed around the first inductor L1. The first inductor L1 and the second inductor L2 may be disposed at a distance that may be influenced by magnetic fields formed around them from each other.

Therefore, since the magnetic field formed around the first inductor L1 affects the second inductor L2, an induced electromotive force may be induced at the second inductor L2. In addition, a current may flow through the second circuit due to the induced electromotive force of the second inductor L2. In this case, the direction of the current flowing through the second circuit may be a forward direction of the first diode DE Therefore, the current generated by the induced electromotive force of the second inductor L2 may be applied to the positive electrode terminal of the second battery cell B2, so that the second battery cell B2 may be charged.

The direction of current flowing through the first circuit and the second circuit depending on the operation state of the switch SW provided in the first circuit will be described in more detail with reference to FIG. 5.

Figure 5:
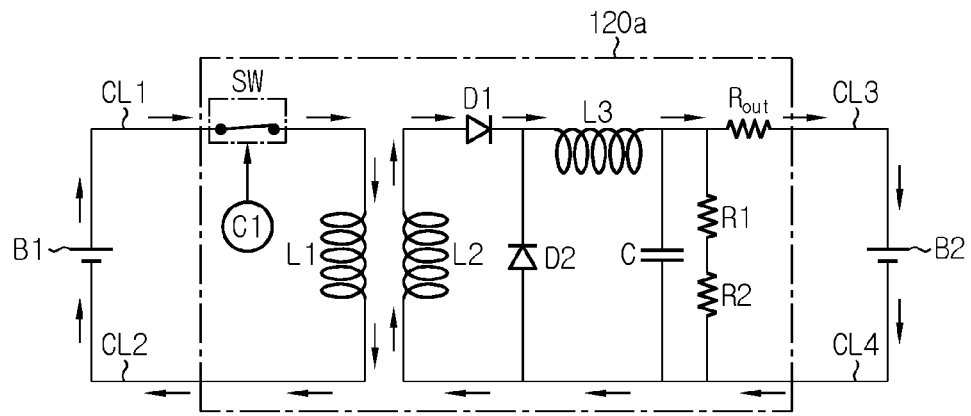
FIG. 5 is a diagram showing a current flow when an operation state of a switch provided in a first circuit is a turn-on state, in the connection configuration of FIG. 4.

FIG. 5 is a diagram showing a current flow when an operation state of a switch SW provided in a first circuit is a turn-on state.

Referring to FIG. 5, if the operation state of the switch SW of the first circuit is controlled to a turn-on state, the first battery cell B1 provided in the first circuit may be discharged. In this case, the current output from the battery cell may flow through the first inductor L1, and a magnetic field may be formed around the first inductor L1.

Referring to the current direction of the first circuit, the direction of the magnetic field formed around the first inductor L1 may be the direction of the current flowing through the first circuit. That is, the magnetism of the other end of the first inductor L1 connected to the negative electrode terminal of the first battery cell B1 may be N, and the magnetism of one end of the first inductor L1 connected to the other end of the switch SW may be S.

A magnetic field may also be formed around the second inductor L2 due to the magnetic field formed around the first inductor L1.

In addition, the second inductor L2 may be affected by the magnetic field formed around the first inductor L1, so that an induced electromotive force may induced.

That is, referring to FIG. 5, a discharging current output from the first battery cell B1 may flow through the first circuit. In addition, a charging current generated based on the induced electromotive force of the second inductor L2 to charge the second battery cell B2 may flow in the second circuit. In this case, the charging current may flow toward the positive electrode terminal of the second battery cell B2.

In addition, the second circuit may include a capacitor C and a plurality of resistors R1, R2, Rout for smoothing the current formed by the induced electromotive force generated at the second inductor L2. Here, the capacitor C may be connected in parallel to the second battery cell B2 or the second inductor L2. In addition, among the plurality of resistors, the resistors R1, R2 may be connected in parallel to the second battery cell B2 or the second inductor L2. In addition, the resistor Rout may be connected in series to the second battery cell B2.

According to this configuration of the present disclosure, since the current flowing through the second circuit is smoothed by the capacitor C and the plurality of resistors R1, R2, Rout provided in the second circuit, noise included in the current flowing through the second circuit may be removed.

As a result, the second circuit may charge the second battery cell B2 through the first diode D1 by using the current generated by the induced electromotive force of the second inductor L2.

The second circuit may be configured to further include a third inductor L3 connected in series between the second inductor L2 and the charging cell.

In the embodiment of FIG. 4, one end of the third inductor L3 may be connected to the other end of the first diode D1, and the other end of the third inductor L3 may be connected to the positive electrode terminal of the second battery cell B2.

Accordingly, referring to FIG. 5, if the switch SW provided in the first circuit is controlled to a turn-on state, a current may flow from one end of the third inductor L3 to the other end of the third inductor L3. Preferably, the inductance of the second inductor L2 may be greater than or equal to the inductance of the third inductor L3. More preferably, the inductance of the second inductor L2 may be greater than the inductance of the third inductor L3.

In addition, the second circuit may be configured to charge the charging cell by using the induced electromotive force of the third inductor L3 induced by the change of the induced electromotive force of the second inductor L2, if the operation state of the switch SW is changed from a turn-on state to a turn-off state.

Specifically, if the operation state of the switch SW provided in the first circuit is changed from a turn-on state to a turn-off state, since a current does not flow in the first circuit, the magnetic field formed around the first inductor L1 may disappear. In this case, the induced electromotive force of the second inductor L2 changes due to electromagnetic inertia, and the current generated by the induced electromotive force of the second inductor L2 may not flow through the second circuit due to the first diode D1.

In addition, the induced electromotive force of the third inductor L3 may be induced by electromagnetic inertia. The second circuit may charge the charging cell by applying the current generated by the induced electromotive force of the third inductor L3 to the positive electrode terminal of the charging cell. That is, if the operation state of the switch SW is changed from a turn-on state to a turn-off state, the third inductor L3 may output the stored power to the charging cell. Therefore, the second circuit may charge the charging cell by using the induced electromotive force of the third inductor L3.

A configuration in which a current flows through the first circuit and the second circuit according to the operation state of the switch SW provided in the first circuit will be described in more detail with reference to FIG. 6.

Figure 6:
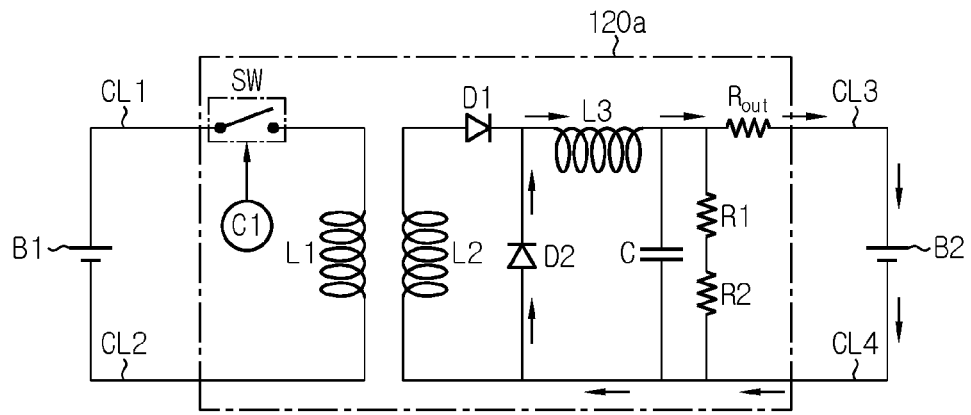
FIG. 6 is a diagram showing a current flow when the operation state of the switch provided in the first circuit is changed from a turn-on state to a turn-off state, in the connection configuration of FIG. 4.

FIG. 6 is a diagram showing a current flow when the operation state of the switch SW provided in the first circuit is changed from a turn-on state to a turn-off state, in the connection configuration of FIG. 4.

Referring to FIG. 6, the second circuit may further include a second diode D2. One end of the second diode D2 may be connected between the other end of the first diode D1 and one end of the third inductor L3, and the other end of the second diode D2 may be connected between the other end of the second inductor L2 and the negative electrode terminal of the second battery cell B2. That is, the second diode D2 may be connected in parallel to the second inductor L2 and the second battery cell B2, and the forward direction of the second diode D2 may be a direction toward the third inductor L3 and the positive electrode terminal of the second battery cell B2.

If the switch SW provided in the first circuit is changed to a turn-off state, a current may not flow in the first circuit. In addition, due to the electromagnetic inertia, a high potential and a low potential of the induced electromotive force of the second inductor L2 may be changed with each other. That is, one end of the second inductor L2 connected to one end of the first diode D1 may be changed to a low potential, and the other end of the second inductor L2 may be changed to a high potential. In this case, the current generated by the induced electromotive force of the second inductor L2 may not flow in the second circuit due to the first diode D1.

Meanwhile, when the operation state of the switch SW is a turn-on state, a current may flow from one end of the third inductor L3 to the other end of the third inductor L3. After that, if the operation state of the switch SW is changed to a turn-off state so that the current generated by the induced electromotive force of the second inductor L2 cannot flow in the second circuit, the induced electromotive force of the third inductor L3 may be induced due to the electromagnetic inertia. In this case, one end of the third inductor L3 connected to the other end of the first diode D1 may be a low potential, and the other end side of the third inductor L3 may be a high potential. Accordingly, the third inductor L3 may output the stored power to the second battery cell B2, and at this time, the flow direction of the current may be the same as the forward direction of the second diode D2 as shown in FIG. 6.

In this way, even if the switch SW of the first circuit is controlled to a turn-off state, the current may be supplied to the charging cell by the third inductor L3. That is, in the embodiment of FIG. 6, the current generated by the induced electromotive force of the third inductor L3 may be applied to the positive electrode terminal of the second battery cell B2, so that the second battery cell B2 is charged. However, if the operation state of the switch SW is changed from a turn-on state to a turn-off state, the magnitude of the charging current applied to the second battery cell B2 may gradually decrease compared to the case where the operation state of the switch SW is a turn-on state.

If the battery management apparatus 100 according to this embodiment of the present disclosure is used, since the charging cell is charged using the plurality of inductors L1 to L3 and the induced electromotive force, it is possible to prevent a sudden change of the charging current. Therefore, it is possible to prevent the charging cell from being degraded as a charging current that changes rapidly is applied thereto.

In addition, the battery management apparatus 100 according to this embodiment of the present disclosure may improve the accuracy and reliability of determining whether the charging cell is degraded by preventing a rapid change of the charging current.

The measuring unit 110 may be configured to measure a charging current for the charging cell.

For example, in the embodiment of FIG. 4, the measuring unit 110 may measure voltages at both ends of the resistor Rout provided in the second circuit. In addition, the measuring unit 110 may calculate a charging current applied to the second battery cell B2 based on the resistance of the resistor Rout and the difference between the voltages at both ends of the resistor Rout.

As another example, in the embodiment of FIG. 4, the measuring unit 110 may measure voltages at both ends of the second resistor R2 provided in the second circuit. In addition, the measuring unit 110 may calculate a charging current applied to the second battery cell B2 based on the resistance of the second resistor R2 and the difference between the voltages at both ends of the second resistor R2.

As another example, in the embodiment of FIG. 4, a current meter may be further provided in the second circuit. Preferably, the current meter may be connected in series between the resistor Rout and the positive electrode terminal of the second battery cell B2. The measuring unit 110 may measure the charging current applied to the second battery cell B2 by means of the current meter provided in the second circuit.

The control unit 130 may be configured to control the operation state of the switch SW such that the magnitude of the charging current measured by the measuring unit 110 is included within a predetermined current range.

Heretofore, the flow of the charging current applied to the charging cell according to the operation state of the switch SW has been described with reference to FIGS. 5 and 6.

Hereinafter, a change amount of the charging current according to the operation state of the switch SW will be described with reference to FIG. 7.

Figure 7:
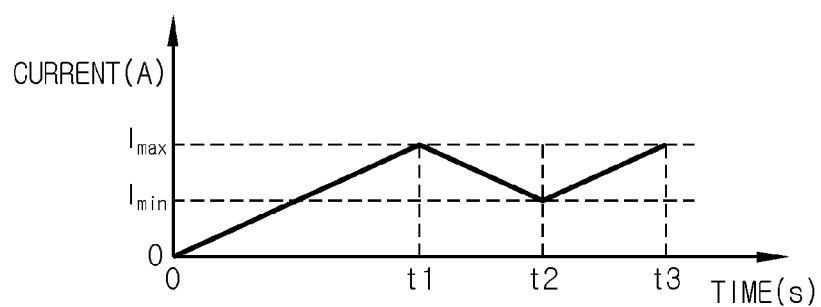
FIG. 7 is a diagram showing a current change according to time, in the current flows shown in FIGS. 5 and 6.

FIG. 7 is a diagram showing a current change according to time, in the current flows shown in FIGS. 5 and 6.

Referring to FIG. 7, 0 (s) corresponds to a time when the control unit 130 transmits a turn-on command to the switch SW through the command line.

The change in the magnitude of current during the time between 0 (s) and t1 (s) corresponds to the change in the magnitude of the charging current after the operation state of the switch SW is controlled from a turn-off state to a turn-on state. That is, if the control unit 130 transmits the turn-on command to the switch SW through the command line at the time point 0 (s), the magnitude of the charging current applied to the charging cell may gradually increase from 0 [A] to Imax [A].

That is, the change in the magnitude of current during the time between 0 (s) to t1 (s) may correspond to the change in the magnitude of the charging current in the embodiment shown in FIG. 5.

t1 (s) corresponds to a time when the control unit 130 transmits a turn-off command to the switch SW through the command line.

The change in the magnitude of the current during the time between t1 (s) to t2 (s) corresponds to the change in the magnitude of the charging current when the operation state of the switch SW is controlled from a turn-on state to a turn-off state. That is, if the control unit 130 transmits the turn-off command to the switch SW through the command line at the time point t1 (s), the magnitude of the charging current applied to the charging cell may gradually decrease from Imax [A] to Imin [A].

That is, the change in the magnitude of current during the time between t1 (s) to t2 (s) may correspond to the change in the magnitude of the charging current in the embodiment shown in FIG. 6.

t2 (s) corresponds to a time when the control unit 130 transmits the turn-on command to the switch SW through the command line.

The change in the magnitude of current during the time between t2 (s) to t3 (s) corresponds to the change in the magnitude of the charging current when the operation state of the switch SW is controlled from a turn-off state to a turn-on state. That is, if the control unit 130 transmits the turn-on command to the switch SW through the command line, the magnitude of the charging current applied to the charging cell may gradually increase from Imin [A] to Imax [A].

Referring to the embodiment of FIG. 7, the control unit 130 may control the operation state of the switch SW provided in the converter 120 so that the magnitude of the charging current applied to the charging cell is included within a predetermined current range, for example within the range of Imin [A] to Imax [A].

Preferably, the control unit 130 may transmit a turn-off command to switch SW through the command line if the magnitude of the charging current reaches an upper limit (Imax) of the predetermined current range, so that the magnitude of the charging current is included within the predetermined current range and maintain a constant size. In addition, if the magnitude of the charging current reaches a lower limit (Imin) of the predetermined current range, the control unit 130 may transmit a turn-on command to the switch SW through the command line. That is, even if the state of the switch SW is controlled to a turn-on state or a turn-off state by the plurality of inductors L1 to L3, the magnitude of the charging current increases or decreases gently, and thus the magnitude of the charging current may be included within the predetermined current range.

In this way, the control unit 130 may maintain the magnitude of the charging current constantly within a certain range by controlling the operation state of the switch SW provided in the converter 120. In addition, since the charging current is prevented from changing greatly and is maintained within a certain range in this way, the control unit may easily identify the internal resistance value of the charging cell, namely a degradation rate thereof, by calculating the voltage change rate of the charging cell for a predetermined time, without considering a current change rate.

Considering Ohm's law, a voltage may be proportional to resistance in a situation where the magnitude of the charging current is kept constant. Therefore, if the internal resistance value of the charging cell increases, it may be determined that the voltage change rate of the charging cell is also increased than a reference rate.

Accordingly, the control unit 130 may compare the measured voltage change rate of the charging cell with the reference rate by maintaining the magnitude of the charging current relatively constant, and estimate the internal resistance value of the charging cell based on the result. For example, it is assumed that the magnitude of the charging current is kept constant and the reference rate is 8%. If the voltage change rate of the charging cell measured during the predetermined time is 10%, the control unit 130 may estimate that the charging cell is degraded and the internal resistance value of the charging cell is increased by about 2% compared to the BOL battery cell.

Therefore, the battery management apparatus 100 may prevent the charging current from rapidly changing by means of the plurality of inductors L1 to L3 included therein.

In addition, the battery management apparatus 100 may estimate the internal resistance value of the battery cell through the voltage change amount of the battery cell without a separate device by controlling the switch SW to keep the magnitude of the charging current constant. Accordingly, it is possible not only to determine whether the battery cell is degraded, but also to improve the accuracy and reliability of determining whether the battery cell is degraded, since the internal resistance value of the battery cell is estimated together.

Figure 8:
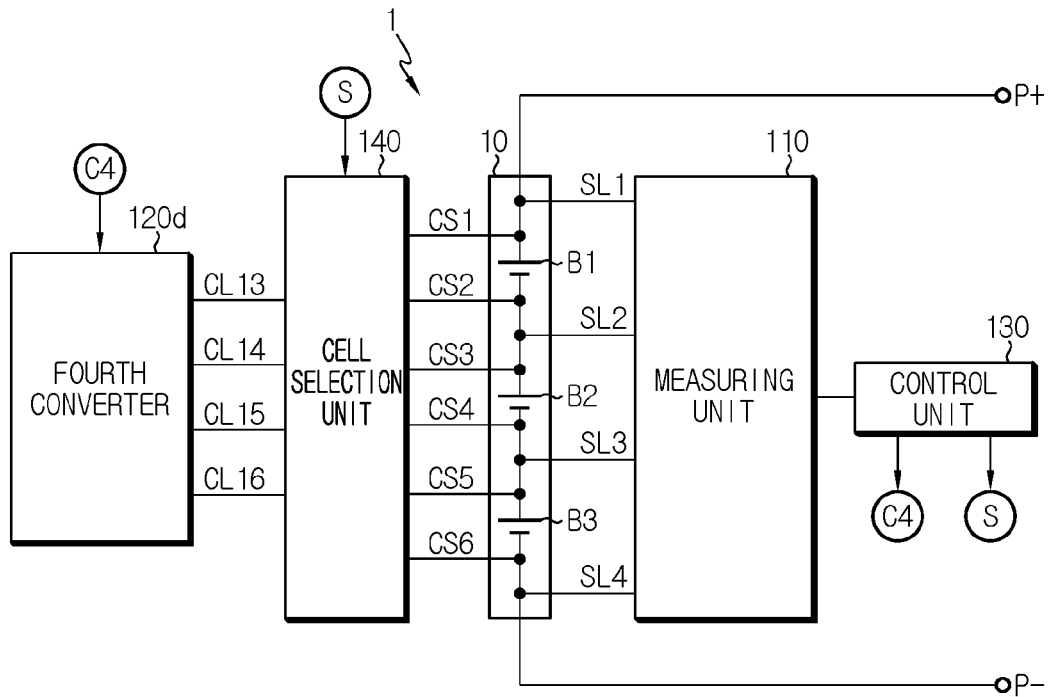
FIG. 8 is a diagram schematically showing a configuration of a battery pack including a battery management apparatus according to another embodiment of the present disclosure.

FIG. 8 is a diagram schematically showing a configuration of a battery pack 1 including a battery management apparatus 100 according to another embodiment of the present disclosure.

Hereinafter, a feature distinguished from the battery management apparatus 100 described above will be described, and a feature identical thereto will not be described.

Meanwhile, a fourth converter 120d shown in FIG. 8 is intended to refer to a converter that is distinguished from the first converter 120a, the second converter 120b and the third converter 120c in the former drawings. Therefore, the battery management apparatus 100 according to the embodiment of FIG. 8 may not include the first converter 120a, the second converter 120b and the third converter 120c. Similarly, a thirteenth line CL13, a fourteenth line CL14, a fifteenth line CL15 and a sixteenth line CL16 are also intended to refer to lines distinguished from the first to twelfth lines CL1 to CL12 in the former drawings. In a similarly way, a fourth command line C4 is also intended to refer to a line that is distinguished from the first to third command lines C1 to C3 in the former drawings.

Referring to FIGS. 1 and 8, the battery management apparatus 100 may further include a cell selection unit 140.

The cell selection unit 140 may be configured to be connected between the plurality of battery cells B1 to B3 and the converter 120.

One side of the cell selection unit 140 may be connected to each of the plurality of battery cells B1 to B3 included in the battery module 10, and the other side of the cell selection unit 140 may be connected to the converter 120. In this case, the battery management apparatus 100 may include one converter 120.

Preferably, the cell selection unit 140 may be connected to each of the plurality of battery cells B1 to B3 through at least two lines. That is, the cell selection unit 140 may be connected to the positive electrode terminal and the negative electrode terminal of each of the plurality of battery cells B1 to B3.

For example, in the embodiment of FIG. 8, the cell selection unit 140 may be connected to the positive electrode terminal and the negative electrode terminal of the first battery cell B1 through a first cell selection line CS1 and a second cell selection line CS2. In addition, the cell selection unit 140 may be connected to the positive electrode terminal and the negative electrode terminal of the second battery cell B2 through a third cell selection line CS3 and a fourth cell selection line CS4. In addition, the cell selection unit 140 may be connected to the positive electrode terminal and the negative electrode terminal of the third battery cell B3 through a fifth cell selection line CS5 and a sixth cell selection line CS6.

In addition, referring to FIG. 8, the cell selection unit 140 may be connected to the fourth converter 120*d* through four lines in total. Here, two lines may be connected to a first circuit of the fourth converter 120*d*, and the other two lines may be connected to a second circuit thereof. Specifically, the cell selection unit 140 may be connected to the first circuit of the converter 120 through the thirteenth line CL13 and the fourteenth line CL14 and connected to the second circuit of the fourth converter 120*d* through the fifteenth line CL15 and the sixteenth line CL16.

The cell selection unit 140 may be configured to receive a cell selection command from the control unit 130.

Referring to FIG. 8, the control unit 130 may transmit the cell selection command to the cell selection unit 140 through a cell selection command line S.

For example, the control unit 130 may transmit a command to connect the first battery cell B1 to the discharging cell and connect the second battery cell B2 to the charging cell to the cell selection unit 140 through the cell selection command line S.

The cell selection unit 140 may be configured to connect some battery cells among the plurality of battery cells B1 to B3 to the converter 120 based on the received cell selection command.

Specifically, the cell selection unit 140 may include a plurality of connection switches therein. The cell selection unit 140 may connect some battery cells corresponding to the cell selection command to the converter 120 by controlling the operation state of each of the plurality of connection switches to correspond to the received cell selection command.

For example, as in the former embodiment, it is assumed that the control unit 130 transmits a cell selection command to the cell selection unit 140 to connect the first battery cell B1 to the discharging cell and connect the second battery cell B2 to the charging cell. In this case, the cell selection unit 140 may internally connect the thirteenth line CL13 and the first cell selection line CS1 and connect the fourteenth line CL14 and the second cell selection line CS2 in order to connect the first battery cell B1 to the first circuit of the fourth converter 120*d*. In addition, the cell selection unit 140 may internally connect fifteenth line CL15 and third cell selection line CS3 and connect the sixteenth line CL16 and the fourth cell selection line CS4 in order to connect the second battery cell B2 to the second circuit of the fourth converter 120*d*.

The current flow when the first battery cell B1 and the second battery cell B2 are connected to the converter 120 by the cell selection unit 140 will be described with reference to FIG. 9.

Figure 9:
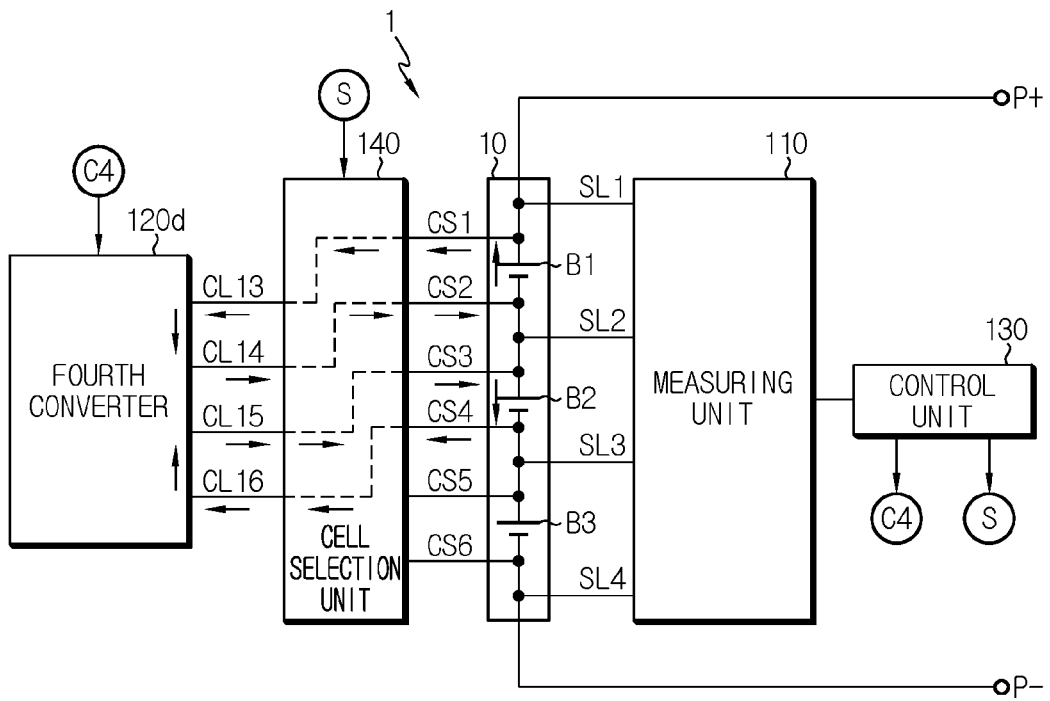
FIG. 9 is a diagram showing an example of a current flow, in the battery pack shown in FIG. 8.

FIG. 9 is a diagram showing an example of a current flow, in the battery pack 1 shown in FIG. 8.

Referring to FIG. 9, the first battery cell B1 connected to the first circuit of the fourth converter 120*d* may be discharged, and the second battery cell B2 connected to the second circuit of the fourth converter 120*d* may be charged by the electromotive force induced by the discharge of the first battery cell B1.

After that, the control unit 130 may determine whether the second battery cell B2 serving as a charging cell is degraded by controlling the operation state of the switch SW provided in the fourth converter 120*d* to a turn-on state or a turn-off state through the fourth command line C4. In addition, the control unit 130 may also estimate the internal resistance value of the second battery cell B2 by maintaining the magnitude of the charging current to be included within a predetermined current range.

That is, the battery management apparatus 100 may further include a cell selection unit 140 to connect a battery cell selected by the control unit 130 among the plurality of battery cells B1 to B3 to the converter 120. That is, the battery management apparatus 100 may select various combinations of the discharging cell and the charging cell and connect the corresponding battery cells to the converter 120, without connecting each of the plurality of battery cells B1 to B3 to the converter 120 according to a predetermined arrangement order of the battery cells.

Accordingly, since the battery management apparatus 100 may selectively determine whether some battery cells among the plurality of battery cells B1 to B3 are degraded, the determination of whether the battery cells are degraded may be performed flexibly.

The battery management apparatus 100 according to the present disclosure may be applied to a battery management system (BMS). That is, the BMS according to the present disclosure may include the battery management apparatus 100 described above. In this configuration, at least some components of the battery management apparatus 100 may be implemented by supplementing or adding functions of components included in the conventional BMS. For example, the measuring unit 110, the converter 120, the control unit 130 and the cell selection unit 140 may be implemented as components of the BMS. In addition, the BMS may balance the plurality of battery cells B1 to B3 or diagnose the insulating resistors of each of the plurality of battery cells B1 to B3 by using at least one of components of the battery management apparatus 100.

In addition, the battery management apparatus 100 according to the present disclosure may be provided to a battery pack 1. That is, the battery pack 1 according to the present disclosure may include the battery management apparatus 1 described above. Here, the battery pack 1 may include the battery module 10 having at least one battery cell, the battery management apparatus 100, electrical equipment (a relay, a fuse, etc.) and a case.

The embodiments of the present disclosure described above may not be implemented only through an apparatus and method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

In addition, since the present disclosure described above can be substituted, modified and changed in various ways by those skilled in the art without departing from the technical idea of the present disclosure, the present disclosure is not limited by the embodiments described above and the accompanying drawings, and all or some of the embodiments may be selectively combined to enable various modifications.

EXPLANATION OF REFERENCE SIGNS

1: battery pack
10: battery module
100: battery management apparatus
110: measuring unit
120: converter
120a: first converter
120b: second converter
120c: third converter
120d: fourth converter
130: control unit
140: cell selection unit
B1: first battery cell
B2: second battery cell
B3: third battery cell

What is claimed is:

1. A battery management apparatus, comprising:
a voltage sensor configured to measure a respective voltage of each of a plurality of battery cells;
a converter connected to at least a pair of the plurality of battery cells and configured to form a charge and discharge path between the at least a pair of battery cells according to an operation state of a switch included in the converter; and
a control unit configured to:
receive a respective voltage value of each of the plurality of battery cells from the voltage sensor;
control the operation state of the switch included in the converter;
calculate a voltage change rate of a charging cell charged by the converter based on the operation state of the switch; and
determine whether the charging cell is degraded based on the calculated voltage change rate, and
wherein the battery management apparatus comprises a plurality of converters including the converter,
wherein each of the plurality of converters is positioned between a respective pair of battery cells of the plurality of battery cells,
wherein each of the plurality of converters includes a respective switch, and
wherein the control unit is configured to:
control the operation state of each switch included in the plurality of converters; and
determine whether each charging cell charged by the plurality of converters is degraded.

2. The battery management apparatus according to claim 1,
wherein the control unit is configured to:
obtain an initial voltage value of the charging cell from the voltage sensor;
calculate the voltage change rate of the charging cell for a predetermined duration of time based on the initial voltage value;
compare the calculated voltage change rate to a predetermined reference rate; and
determine whether the charging cell is degraded based on the comparison.

3. The battery management apparatus according to claim 1,
wherein the control unit is configured to:
sequentially control the operation states of each of the switches included in the plurality of converters to a turn-on state; and
determine whether each of the plurality of battery cells is degraded based on the sequential control.

4. The battery management apparatus according to claim 3,
wherein the sequential control of the plurality of converters comprises selection of a respective converter at every predetermined time interval.

5. The battery management apparatus according to claim 1,
wherein the converter includes:
a first circuit including the switch, a discharging cell and a first inductor connected in series; and
a second circuit including the charging cell and a second inductor configured to be inductively coupled to the first inductor connected in series,
wherein the second circuit is configured to charge the charging cell using an induced electromotive force of the second inductor induced by the first inductor in response to the operation state of the switch being controlled to a turn-on state.

6. The battery management apparatus according to claim 1, wherein the converter is connected to at least three battery cells of the plurality of battery cells, the battery management apparatus further comprising:
a cell selection circuit connected between the at least three battery cells and the converter and configured to:
receive a cell selection command from the control unit; and
connect a portion of the at least three battery cells to the converter based on the received cell selection command.

7. A battery pack, comprising the battery management apparatus according to claim 1.

8. A battery management apparatus, comprising:
a voltage sensor configured to measure a respective voltage of each of a plurality of battery cells;
a converter connected to at least a pair of the plurality of battery cells and configured to form a charge and discharge path between the at least a pair of battery cells according to an operation state of a switch included in the converter; and
a control unit configured to:
receive a respective voltage value of each of the plurality of battery cells from the voltage sensor;

control the operation state of the switch included in the converter;

calculate a voltage change rate of a charging cell charged by the converter based on the operation state of the switch; and determine whether the charging cell is degraded based on the calculated voltage change rate, wherein the converter includes:

a first circuit including the switch, a discharging cell and a first inductor connected in series; and a second circuit including the charging cell and a second inductor configured to be inductively coupled to the first inductor connected in series, wherein the second circuit is configured to charge the charging cell using an induced electromotive force of the second inductor induced by the first inductor in response to the operation state of the switch being controlled to a turn-on state, wherein the second circuit further includes a third inductor connected in series between the second inductor and the charging cell, and wherein the second circuit is configured to charge the charging cell using an induced electromotive force of the third inductor induced by a change of the induced electromotive force of the second inductor in response to the operation state of the switch being changed from the turn-on state to a turn-off state.

9. The battery management apparatus according to claim 8, further comprising a current sensor configured to measure a charging current for the charging cell, wherein the control unit is configured to control the operation state of the switch to bring a magnitude of the charging current measured by the current sensor within a predetermined current range.

10. The battery management apparatus according to claim 8, wherein the converter is connected to at least three battery cells of the plurality of battery cells, the battery management apparatus further comprising:

a cell selection circuit connected between the at least three battery cells and the converter and configured to:

receive a cell selection command from the control unit; and connect a portion of the at least three battery cells to the converter based on the received cell selection command.

11. A battery pack, comprising the battery management apparatus according to claim 8.

* * * * *